US010992304B2

(12) United States Patent
Pavao Moreira et al.

(10) Patent No.: US 10,992,304 B2
(45) Date of Patent: Apr. 27, 2021

(54) METHODS AND APPARATUSES FOR DIGITALLY CONTROLLED OSCILLATOR FREQUENCY RESOLUTION CONTROL

(71) Applicant: NXP USA, INC., Austin, TX (US)

(72) Inventors: Cristian Pavao Moreira, Frouzins (FR); Didier Salle, Toulouse (FR); Stephane Damien Thuries, Saubens (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/875,526

(22) Filed: May 15, 2020

(65) Prior Publication Data

US 2020/0366299 A1 Nov. 19, 2020

(30) Foreign Application Priority Data

May 15, 2019 (EP) .................................... 19315035

(51) Int. Cl.
*H03L 7/099* (2006.01)
*G01S 7/35* (2006.01)
(Continued)

(52) U.S. Cl.
CPC ................ *H03L 7/099* (2013.01); *G01S 7/35* (2013.01); *G01S 13/343* (2013.01); *H03L 7/093* (2013.01); *H03L 2207/50* (2013.01)

(58) Field of Classification Search
CPC ........ H03L 7/099; H03L 7/093; G01S 13/343
(Continued)

(56) References Cited

U.S. PATENT DOCUMENTS 9,379,721 B2 6/2016 Pavao-Moreira et al.
9,660,578 B2 5/2017 Pavao-Moreira et al.
(Continued)

FOREIGN PATENT DOCUMENTS

CN 107356919 11/2017

OTHER PUBLICATIONS

Park, J., "76-81-GHz CMOS Transmitter with a Phase-Locked-Loop-Based Mutichirp Modulator for Automotive Repair", IEEE Transactions on Microwave Theory and Techniques, vol. 63, No. 4, Apr. 2015.

(Continued)

*Primary Examiner* — Ted M Wang

(57) ABSTRACT

An example apparatus (100) is for use for use with front-end circuitry (102) to transmit and receive radar wave signals, The apparatus (100) includes digital phase locked loop (PLL) circuitry (104) and a control circuit (106). The digital PLL circuitry (106) provides a chirp sequence with frequency modulated continuous wave signals (FMCW), the FMCW signals being chirps containing a start frequency and a stop frequency, representing a selected chirp bandwidth (BW). The digital PLL circuitry (104) includes the DCO circuit (108) which frequency resolution is configured and arranged to be tuned relative to the selected chirp BW, the frequency resolution configured in response to a selected level of capacitance. The control circuit (106) controls the selected level of capacitance used by the DCO circuit (108) by changing the frequency resolution of the DCO according to the selected chirp BW, wherein different frequency resolutions are used for a first selected chirp BW and for a second selected chirp BW.

15 Claims, 10 Drawing Sheets

(51) Int. Cl.
*G01S 13/34* (2006.01)
*H03L 7/093* (2006.01)

(58) Field of Classification Search
USPC .......................................................... 375/376
See application file for complete search history.

(56) References Cited

U.S. PATENT DOCUMENTS

| | | | | |
|---|---|---|---|---|
| 10,340,926 | B2 * | 7/2019 | Chillara | H03K 3/80 |
| 10,382,045 | B2 * | 8/2019 | Moehlmann | H03L 7/099 |
| 2017/0012631 | A1 | 1/2017 | Dato et al. | |
| 2017/0126237 | A1 * | 5/2017 | Pavao Moreira | H03B 5/1265 |
| 2018/0123605 | A1 * | 5/2018 | Salle | H03L 7/085 |

OTHER PUBLICATIONS

Wu, W., "A 56.4-to-63.4 GHz Multi-Rate All-Digital Fractional-N PLL for FMCW Radar Applications in 65 nm CMOS", IEEE Journal of Solid-State Circuits, vol. 49, No. 5, May 2014.

* cited by examiner

METHODS AND APPARATUSES FOR DIGITALLY CONTROLLED OSCILLATOR FREQUENCY RESOLUTION CONTROL

CROSS-REFERENCE TO RELATED APPLICATIONS

This application claims the priority under 35 U.S.C. § 119 of European Patent application no. 19315035.6,filed on 15 May 2019, the contents of which are incorporated by reference herein.

OVERVIEW

Aspects of various embodiments are directed to apparatuses and methods involving frequency resolution control of a digitally controlled oscillator (DCO) circuit according to a selected chirp bandwidth.

DCOs can be used to replace conventional voltage controlled oscillator. A DCO circuit includes an array of switchable capacitive elements, for example varactors, that form a capacitive arrangement. The capacitive arrangement defines the frequency of the DCO circuit. Each of the switchable capacitive element can enable a frequency step.

These and other matters have presented challenges to efficiencies of DCO circuit implementations, for a variety of applications.

SUMMARY

Various example embodiments are directed to issues such as those addressed above and/or others which may become apparent from the following disclosure concerning control of a frequency resolution of a digitally controlled oscillator (DCO) circuit according to a selected chirp bandwidth (BW).

In certain example embodiments, aspects of the present disclosure involve tuning a frequency resolution of a DCO circuit according to the selected chirp BW including causing the DCO circuit to sequence through different sets of capacitive value steps for different selected chirp BWs.

In a more specific example embodiment, an apparatus is for use with a front-end circuit that transmits and receives radar wave signals. The apparatus includes digital phase locked loop (PLL) circuitry having a DCO circuit and a control circuit. The digital PLL circuitry provides a chirp sequence with frequency modulated continuous wave (FMCW) signals, the FMCW signals being chirps containing a start frequency (F1) and a stop frequency (F2), representing a selected chirp bandwidth (BW) of F2–F1. The digital PLL circuitry is arranged as a chimp generator and configured to provide the chirp sequence with the FMCW signal. The DCO circuit has a frequency resolution that is tuned relative to the selected chirp BW, the frequency resolution configured in response to a selected level of capacitance. The control circuit controls the selected level of capacitance used by the DCO circuit by changing the frequency resolution of the DCO according to the selected chirp BW, wherein different frequency resolutions are used for a first selected chirp BW and for a second selected chirp BW.

The control circuit, in specific embodiments, changes the frequency resolution of the DCO circuit by causing the selected capacitance level to sequence through different capacitance value steps for the first selected chirp BW than for the second selected chirp BW, wherein a maximum difference between capacitance value steps for the first selected chirp BW is less than a minimum difference between capacitance value steps for the second selected chirp BW. The first selected chirp BW is associated with first range radar waves and the second selected chirp BW is associated with second range radar waves, with the second radar range being shorter than the first radar range. In a number of aspects, the capacitance value steps of the first set are equally spaced. In other aspects and/or in addition, the capacitance value steps of the second set are equally spaced.

The DCO circuit can include a capacitance bank to provide the selected capacitance level according to the frequency resolution and with a selected frequency offset compensation. In a specific example, the DCO includes a capacitive arrangement having a plurality of programmable capacitive circuits that determine the frequency of an output frequency signal of the DCO circuit and which provide the selected level of capacitance, the selected level of capacitance representing a given capacitance value and a given capacitance step. For example, the control circuit changes the frequency resolution of the DCO by causing the selected capacitance level to sequence through the first set of capacitance value steps for the first selected chirp BW and to sequence through a second set of capacitance value steps for the second selected chimp BW, the first set of capacitance value steps being different from (e.g., smaller or larger) than the second set of capacitance value steps. The control circuit controls the selected level of capacitance used by the DCO circuit includes changing the frequency resolution of the DCO circuit according to the selected chirp BW for optimizing a tuning range of a FMCW transceiver, in which the front-end circuit is a FMCW transceiver. The FMCW radar transceiver to transmit and receive the radar wave signals corresponding to long range radar (LRR) waves and short range radar (SRR) waves in response thereto. For example, a maximum difference between capacitance value steps of the LRR waves can be less than a minimum difference between capacitance value steps of the SRR waves.

In various aspects, the DCO circuit includes a first capacitance bank and a second capacitance bank configured to provide the selected capacitance level, the first and second capacitance banks to sequence through a first set of capacitance value steps for the first selected chirp BW and to sequence through the second set of capacitance value steps for the second selected chirp BW. The control circuit can control the first capacitance bank and the second capacitance bank to simultaneously provide a maximum level of the first set of capacitance value steps and a next level in a sequence of the second set of capacitance value steps.

In another specific example embodiment, the apparatus includes front-end circuitry, the digital PLL circuitry, and the control circuit. The front-end circuitry transmits and receives radar wave signals corresponding to LRR waves and SRR waves, the SRR waves being associated with a shorter range than the LRR waves. The digital PLL circuitry is arranged as a chirp generator to provide a chirp sequence with FMCW signals to the front-end circuitry, the FMCW signals being a chirp containing a start frequency (F1) and a stop frequency (F2), representing a selected chirp BW. The digital PLL circuitry includes a DCO circuit, frequency resolution of which is configured and arranged to be tuned relative to the selected chirp BW, the frequency resolution configured in response to a selected level of capacitance. The control circuit controls the selected level of capacitance used by the DCO circuit by causing the selected capacitance level to sequence through a first set of capacitance value steps for the selected chirp BW associated with the LRR waves and to sequence through a second set of capacitance value steps for the selected chirp BW associated with SRR waves, the first set of capacitance value steps being smaller than the second set of capacitance value steps. As previously described, a maximum difference between capacitance value steps of the LRR waves is less than a minimum difference between capacitance value steps of the SRR waves.

The LRR waves and SRR waves correspond to different chirp BWs for FMCW radar. The front-end circuitry includes circuitry to transmit and receive the radar wave signals, such as a FMCW transceiver.

The DCO circuit includes a capacitive arrangement having a plurality of programmable capacitive circuits that determine a frequency of the output frequency signal of the DCO circuit and which provide the selected level of capacitance. The selected level of capacitance represents a given capacitance value and a given capacitance step. For example, the DCO circuit includes a capacitance bank configured and arranged to provide the selected capacitance level. In various more specific embodiments, the DCO circuit includes a first capacitance bank and a second capacitance bank to provide the selected capacitance level, the first and second capacitance banks to sequence through the first set of capacitance value steps for the LRR waves and to sequence through the second set of capacitance value steps for the SRR waves. The capacitance value steps of the first set and/or the second set are equally spaced, or not equally spaced in specific embodiments.

The control circuit controls the selected level of capacitance used by the DCO circuit by applying a control code to the DCO circuit for setting the first set of capacitance value steps for LRR waves and applying a different control code to the DCO circuit for setting the second set of capacitance value steps for the SRR. In some specific embodiments, the control circuit controls the first capacitance bank and the second capacitance bank to simultaneously provide a maximum level of the first set of capacitance value steps and a next level in the sequence of second set of capacitance value steps.

Other example embodiments are directed to methods of using the above-described apparatuses. An example method receiving radar wave signals corresponding to first range radar waves and second range radar waves, the second range radar waves being associated with a shorter range than the first range radar waves. The method further includes providing, by digital phase PLL circuitry configured and arranged as a chirp generator, a chirp sequence with FMCW signals, the FMCW signals being a chirp containing a start frequency (F1) and a stop frequency (F2), representing a selected chirp BW, the digital PLL circuitry including the DCO circuit which frequency resolution is configured and arranged to be tuned relative to the selected chirp BW, the frequency resolution configured in response to a selected level of capacitance. The method fluffier includes controlling the DCO circuit of the digital PLL circuitry by selecting the level of capacitance used by the DCO circuit and by causing the selected capacitance level to sequence through a first set of capacitance value steps for the selected chirp BW associated with the first range radar waves and to sequence through a second set of capacitance value steps for the selected chirp BW associated with second range radar waves, the first set of capacitance value steps being different from than the second set of capacitance value steps. For example, a maximum difference between capacitance value steps of the first set for the first range radar waves is less than a minimum difference between capacitance value steps of the second set for the second range radar waves.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
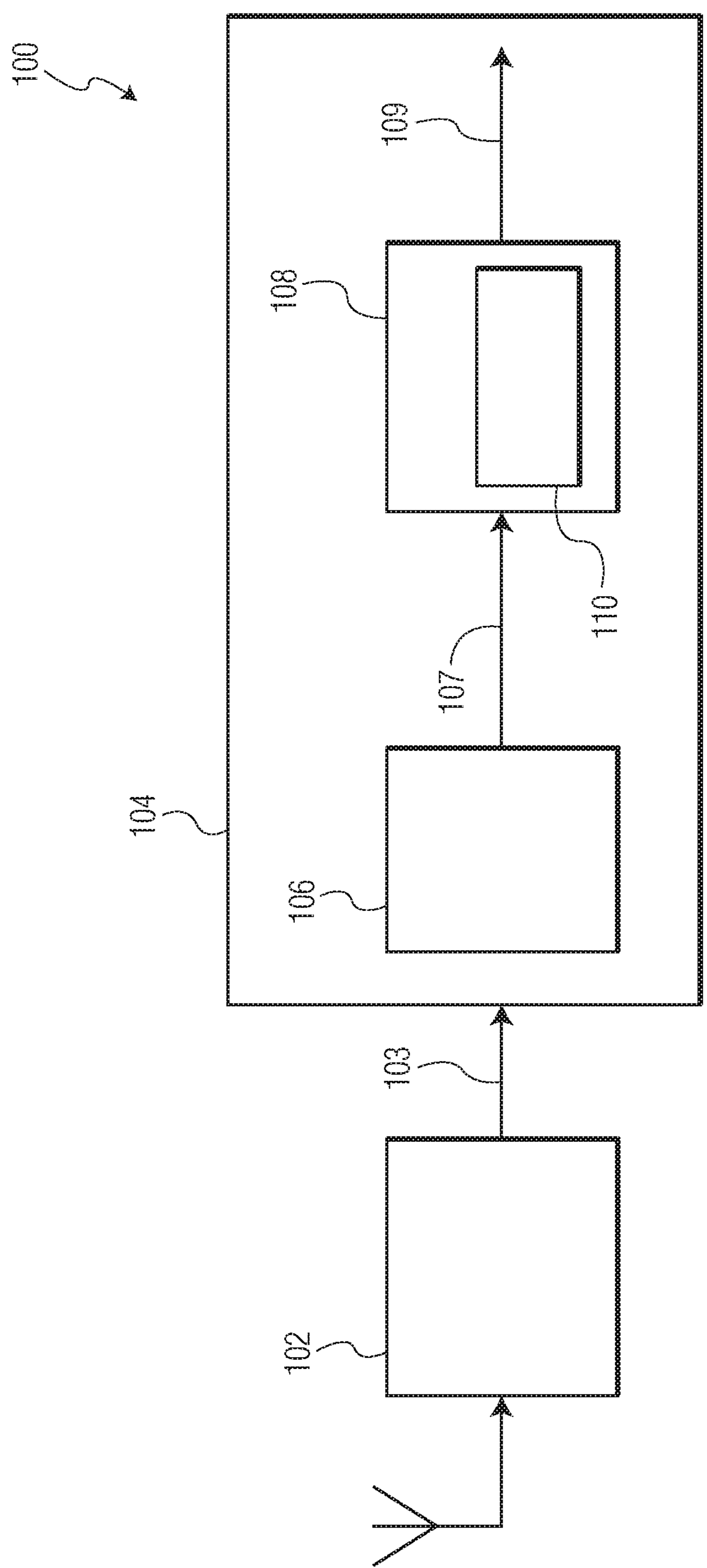
FIG. 1 illustrates an example apparatus for frequency resolution control, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving control of a frequency resolution of a digitally controlled oscillator (DCO) circuit according to a selected chirp bandwidth (BW). In certain implementations, aspects of the present disclosure have been shown to be beneficial when used in the context of use of different frequency resolutions for a first selected chirp BW and a second selected chirp BW. In some embodiments, the selected capacitance value sequences through different capacitance value steps for the first selected chirp BW than for the second selected chirp BW, and thereby generate lower (out of band) noise for the first selected chirp BW than the second in response to the first capacitance step being lower than the second capacitance step. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may he used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various radar transceivers, such as for frequency modulated continuous wave (FMCW) applications, have stringent phase noise requirements. For FMCW radar systems, in addition to phase noise requirements, there can be a tradeoff to achieve a particular chirp time (Tchirp) and chimp BW. For example, higher chirp BW (e.g., 5 GHz) with lower Tchirp can be used in short range radar (SRR) applications. For SRR, in-band phase noise can be of greater importance than for long range radar (LRR) applications to allow for distinguishing between two different close targets. In LRR applications, fast Tchirps with reduced chirp BW (e.g., 1 GHz) can be used. For LRR, out-of-band phase noise can be of greater importance than for SRR to allow for achieving better range resolution. The phase noise generated in radar receivers can be predominantly by the synthesizer, such as a digital phase locked loop (PLL) circuitry. For example, the DCO circuit of the digital PLL circuitry can generate out-of-band phase noise and a time-to-digital circuit can generated in-band noise. The DCO total phase noise (PN_tot) includes intrinsic noise (PN) and quantization noise (QN), which is dictated by the DCO frequency resolution or sometimes referred to as frequency step. Embodiments in accordance with the present disclosure are directed to digital PLL circuitry with a DCO circuit that has a programmable resolution bank used to change a frequency resolution of the DCO circuit according to a selected chirp BW. The frequency resolution can be controlled by adjusting capacitance values of a capacitive arrangement of the DCO circuit to cause the capacitance level to sequence through different capacitance value steps for the SRR waves than for the LRR waves with the SRR waves having larger value steps than the LRR waves. The DCO circuit with programmable resolution banks allows for optimizing a trade-off between QN (e.g., linked to frequency resolution) and tuning range to cover the full modulation chirp BW for LRR and SRR applications. For example, the frequency resolution is coupled with the programmed chirp BW, allowing for relaxing the resolution requirements for higher chirp BW (e.g., SRR applications), where QN can he relaxed. In various embodiments, the same banks can be used for LRR and SRR applications, with a controller increasing frequency step (via capacitive divider-based flexible bank) for SRR applications, allowing to cover its requirement of higher chirp BW.

In accordance with various embodiments, the DCO circuit uses a modulation bank resolution-programmable capacitor divider as a capacitor bank to cover both LRR and SRR waves. The DCO can be calibrated for both the LRR and SRR waves, as further described herein. In various embodiments, the capacitor arrangement includes a plurality of programmable capacitors and/or a programmable offset bank to compensate for a reduction in the off-state capacitance value when moving to the higher frequency steps (or lower resolution). A number of embodiments are directed to an apparatus for use with front-end circuitry that transmits and receives radar wave signals. The apparatus includes digital PLL circuitry having a DCO circuit and a control circuit. The digital PLL circuitry provides a chirp sequence with FMCW signals, the FMCW signals being chirps containing a start frequency (F1) and a stop frequency (F2), representing a selected chirp BW of F2−F1. The digital PLL circuitry is arranged as a chirp generator to provide the chirp sequence with the FMCW signal. The DCO circuit has a frequency resolution (relative to the smallest frequency step) that is tuned relative to the selected chirp BW, the frequency resolution configured in response to a selected level of capacitance. The control circuit controls the selected level of capacitance used by the DCO circuit by changing the frequency resolution of the DCO according to the selected chirp BW, wherein different frequency resolutions are used for a first selected chirp BW and for a second selected chirp BW.

The control circuit, in specific embodiments, changes the frequency resolution of the DCO circuit by causing the selected capacitance level to sequence through different capacitance value steps for the first selected chirp BW than for the second selected chirp BW. For example, a maximum difference between capacitance value steps for the first selected chirp BW is less than a minimum difference between capacitance value steps for the second selected chirp BW. The first selected chirp BW (BW1) is associated with first range radar waves (relative to LRR applications or LRR waves) and the second selected chirp BW (BW2) is associated with second range radar waves (relative to SRR applications or SRR waves with the second radar range being shorter than the first radar range. Radar range, as used herein, is related to or includes the detection distance of a target or targets by the radar sensor using the radar transceiver.

The DCO circuit can include a capacitance bank to provide the selected capacitance level according to the frequency resolution and with a selected frequency offset compensation. For example, the control circuit changes the frequency resolution of the DCO by causing the selected capacitance level to sequence through the first set of capacitance value steps for the first selected chirp BW and to sequence through a second set of capacitance value steps for the second selected chirp BW, the first set of capacitance value steps being different from the second set of capacitance value steps. The control circuit controls the selected level of capacitance used by the DCO circuit includes changing the frequency resolution of the DCO circuit according to the selected chirp BW for optimizing a tuning range of a FMCW transceiver, in which the front-end circuit is a FMCW transceiver. The FMCW radar transceiver transmits and receives the radar wave signals corresponding to LRR waves and SRR waves in response thereto.

Other example apparatus embodiments includes front-end circuitry, the digital PLL circuitry, and the control circuit. The front-end circuitry transmits and receives radar wave signals corresponding to LRR waves and SRR waves, the SRR waves being associated with a shorter range (or detection distance) than the LRR waves. The digital PLL circuitry is arranged as a chirp generator to provide a chirp sequence with FMCW signals to the front-end circuitry, the FMCW signals being a chirp containing a start frequency (F1) and a stop frequency (F2), representing a selected chirp BW F2−F1), The digital PLL circuitry includes a DCO circuit which frequency resolution is tuned relative to the selected chirp BW, the frequency resolution configured in response to a selected level of capacitance. The control circuit controls the selected level of capacitance used by the DCO circuit by causing the selected capacitance level to sequence through a first set of capacitance value steps for the selected chirp BW associated with the LRR waves and to sequence through a second set of capacitance value steps for the selected chirp BW associated with SRR waves, the first set of capacitance value steps being smaller than the second set of capacitance value steps. As previously described, a maximum difference between capacitance value steps of the first set for the LRR waves is less than a minimum difference between capacitance value steps of the second set for the SRR waves.

The DCO circuit includes a capacitive arrangement having a plurality of programmable capacitive circuits that determine a frequency of the output frequency signal of the DCO circuit and which provide the selected level of capacitance. The selected level of capacitance represents a given capacitance value and a given capacitance step. For example, the DCO circuit includes a capacitance bank configured and arranged to provide the selected capacitance level. In various more specific embodiments, the DCO circuit includes a first capacitance bank and a second capacitance bank to provide the selected capacitance level, the first and capacitance banks to sequence through the first set of capacitance value steps for the LRR waves and to sequence through the second set of capacitance value steps for the SRR waves. The capacitance value steps of the first set and/or the second set are equally spaced, or not equally spaced in specific embodiments.

The control circuit controls the selected level of capacitance used by the DCO circuit by applying a control code to the DCO circuit for setting the first set of capacitance value steps for LRR waves and applying a different control code to the DCO circuit for setting the second set of capacitance value steps for the SRR. In some specific embodiments, the control circuit controls the first capacitance bank and the second capacitance hank to simultaneously provide a maximum level of the first set of capacitance value steps and next level in the sequence of second set of capacitance value steps.

Various embodiments are directed to methods of using the above-described apparatuses, such as methods for coupling the programmed DCO resolution to the selected chirp BW, in such a way that the higher the chirp BW, the larger the frequency step provided by the DCO and its control circuit. Other methods include calibrating the DCO circuit, such as calibrating an offset bank in parallel with other resolution-programmable banks and activating the DCO circuit to compensate for the change in the off-state capacitance reduction when moving to higher frequency step (lower resolution).

Turning now to the figures, FIG. I illustrates an example apparatus for frequency resolution control of a DCO circuit, in accordance with the present disclosure. The apparatus 100 includes a digital PLL circuitry 104 and a control circuit 106. In various embodiments, the apparatus 100 further includes front-end circuitry 102. For example, the apparatus 100 can include or form part of a FMCW radar device for detecting objects by radar signals based on continuous waves reflecting from the object. For various applications, such as an automotive radar application, frequency-modulated continuous wave (FMCW) signals can be implemented using a PLL circuit.

The front-end circuitry 102 can include transceiver circuitry that transmits and receives the radar wave signals 103, sometimes represented as continuous wave frequency signals. For example, the front-end circuitry 102 can include front-end receiver circuitry and transmitter circuitry to transmit the radar wave signal and receive reflected radar signals. The radar wave signals 103 can correspond to LRR waves and SRR waves, the SRR waves being associated with a shorter range than the LRR waves and which are associated with the different frequency of the chirps, start frequency F1 and stop frequency F2, both frequencies representing the chirp bandwidth BW of F2−F2. As may be appreciated, the radar wave signals 103 are sometimes referred to as a frequency ramp signal which is transmitted, hits an object, and comes back to the transceiver circuity with a given delay. This delay represents the time-of-flight or the doppler effect and is used to detect objects and, optionally, estimate their distance from the apparatus 100. For example, both the internal receiver signal (e.g., coming from the digital PLL circuitry 104 and not having a delay) and external delayed received signal (e.g., as received by the receiver antenna) are mixed in the receiver (e.g., via receiver mixer or down-convcrtcr), and an intermediate frequency (IF) signal is created, representing the distance of the target.

The digital PLL circuitry 104 acts a chirp generator to generate the chimp sequence, or ramp from a start frequency to a stop frequency. The ramp can have different sizes, which is referred to herein as the chirp BW, depending on the frequency range the radar device is to operate at. As particular examples, for available spectrums of 76 GHz to 81 GHz, such as for automotive radar applications, the chirp BW can range from a few hundreds of MHz to 5 GHz, however embodiments are not so limited. This ramp is a frequency signal 109 that represents or is a FMCW signal which sweeps from the start frequency (F1) to the stop frequency (F2). The sweep is done in a given time period, which can be referred to Tchirp. The frequency signal 109 is generated by the digital PLL circuitry 104 and provided to the front-end circuitry 102 for transmitting. As such, the digital PLL circuitry 104 provides a chirp sequence with or that represents FMCW signals. The FMCW signals are chirps containing the start frequency and the stop frequency and which represent a selected chirp BW. As previously described, different range radar signals can he associated with different chirp BWs.

The digital PLL circuitry 104 includes a DCO circuit 108 in which the frequency resolution is tuned relative to a selected chirp BW and in which the frequency resolution is configured responsive to a selected level of capacitance. As further described herein, the DCO circuit 108 includes a capacitive arrangement 110 having at least one programmable capacitance bank. The capacitance bank provides the selected capacitance level according to the frequency resolution, and in some instances, with a selected frequency offset compensation. In specific embodiments, the offset compensates for a change in the off-state capacitance reduction when moving to the higher frequency step (lower resolution).

In specific embodiments, the capacitive arrangement 110 includes a capacitance bank to provide the selected capacitance level of both first and second selected chirp BWs, such as those associated with SRR and LRR waves, In other embodiments, the capacitive arrangement 110 includes a plurality of programmable capacitive circuits that determine a frequency of the output frequency signal of the DCO circuit and which provide the selected level of capacitance. For example, the capacitive arrangement 110 includes a first capacitance bank and a second capacitance bank configured to provide the selected capacitance level (e.g., capacitance value and capacitance step) of both the first and second selected chirp BWs. The first capacitance bank sequences through the first set of capacitance value steps, such as for the LRR waves. The second capacitance hank sequences through the second set of capacitance value steps, such as for the SRR waves. In such embodiments, the control circuit 106 can control the first capacitance bank and the second capacitance bank to simultaneously provide a maximum level of the first set of capacitance value steps and next (higher) level in the sequence of second set of capacitance value steps.

The selected level of capacitance is controlled by the control circuit 106. The control circuit 106 can change the frequency resolution of the DCO circuit according to the selected chirp BW for optimizing a tuning range of the front-end circuitry 102 (e.g., a FMCW transceiver). For example, the control circuit 106 controls the selected level of capacitance used by the DCO circuit 108 by changing the frequency resolution of the DCO circuit 108 according to the selected chirp BW, and with different frequency resolutions being used for a first selected chirp BW and a second selected chirp BW. In more specific embodiments, the control circuit 106 changes the frequency resolution of the DCO circuit 108 by causing the selected capacitance level to sequence through different capacitance value steps for the first selected chirp BW than for the second selected chirp BW. A maximum difference between capacitance value steps for the first selected chirp BW is less than a minimum difference between capacitance value steps for the second selected chirp BW. The first selected chirp BW can be associated with first range radar waves, such as LRR waves, and the second selected chirp BW can be associated with second range radar waves, such as SRR waves, with the second range being shorter than the first range.

As may be appreciated, LRR waves and SRR waves are used for different range applications, with the LRR waves being used for a longer range than the SRR waves. Example ranges for LRR can include greater than 150 meters and ranges for SRR can include less than 50 meters, although embodiments are not so limited and a variety of ranges can be used.

In more specific and related embodiments, the control circuit 106 causes the selected capacitance level to sequence through a first set of capacitance value steps for the first selected chirp BW, such as for LRR waves, and to sequence through a second set of capacitance value steps for the second selected chirp BW, such as for SRR waves. The first set of capacitance value steps are smaller than the second set of capacitance value steps, which can reduce particular phase noise as previously described. The above-described LRR and SRR waves can correspond to different BWs for FMCW radar. In various embodiments, the capacitance steps values of the first and/or second set are equally spaced. However, embodiments are not so limited and one or both of the capacitance s value steps of the first and/or second set may be unequally spaced. The selected level of capacitance and/or frequency resolution can be controlled by the control circuit 106 applying a control code 107 to the DC( )circuit 108 for setting the first set of capacitance value steps and applying a different control code 107 to the DCO circuit 108 for setting the second set of capacitance value steps. By controlling the frequency resolution of the DCO circuit 108, the chirp sequence, e.g., the frequency signal 109 with or representing the FMCW signal, is tuned relative to the selected chirp BW. The control codes can include programmed Frequency Control Word (FCW).

Figure 2A:
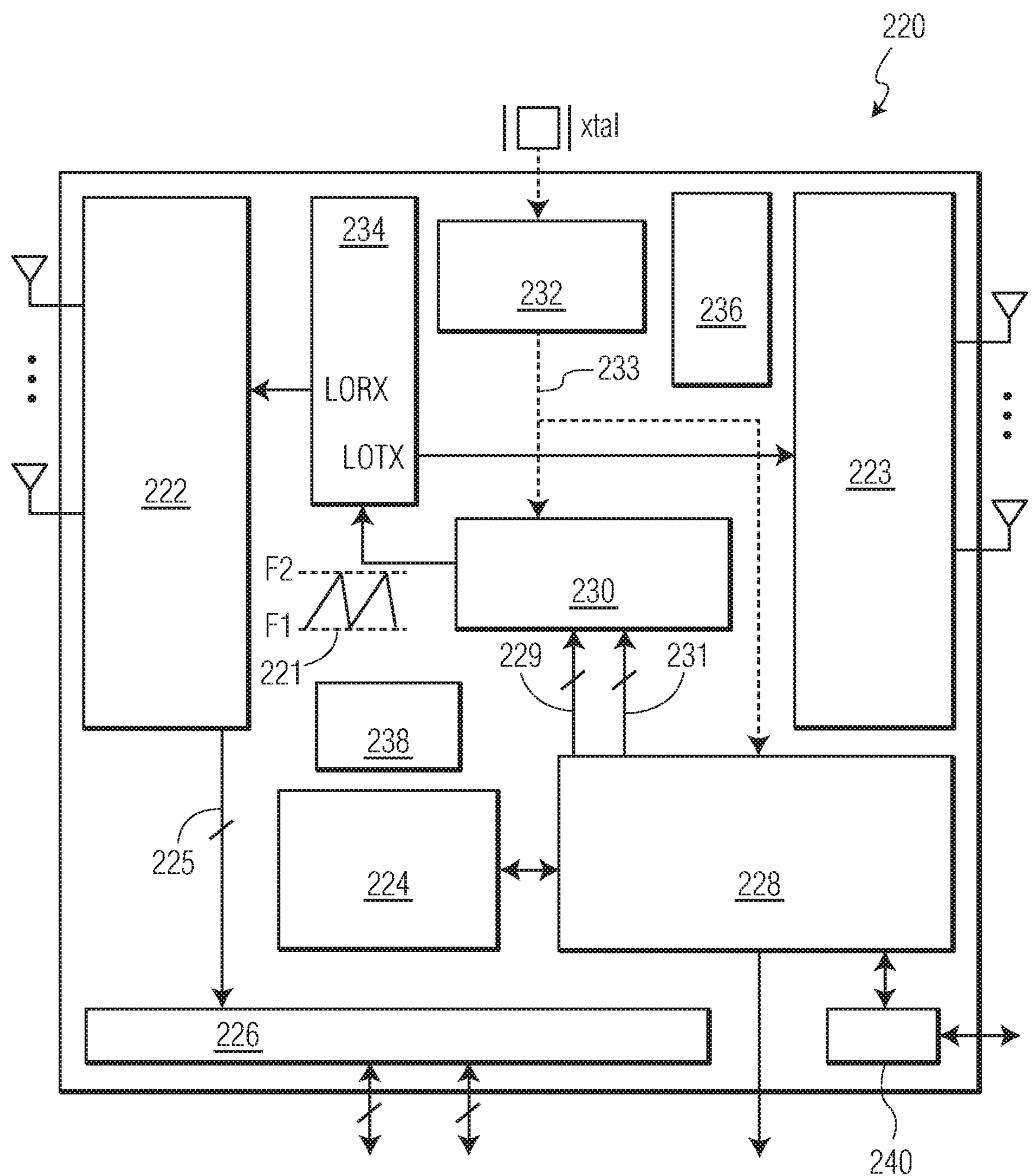
FIGS. 2A-2B illustrate further example apparatuses for frequency resolution control, in accordance with the present disclosure.
Figure 2B:
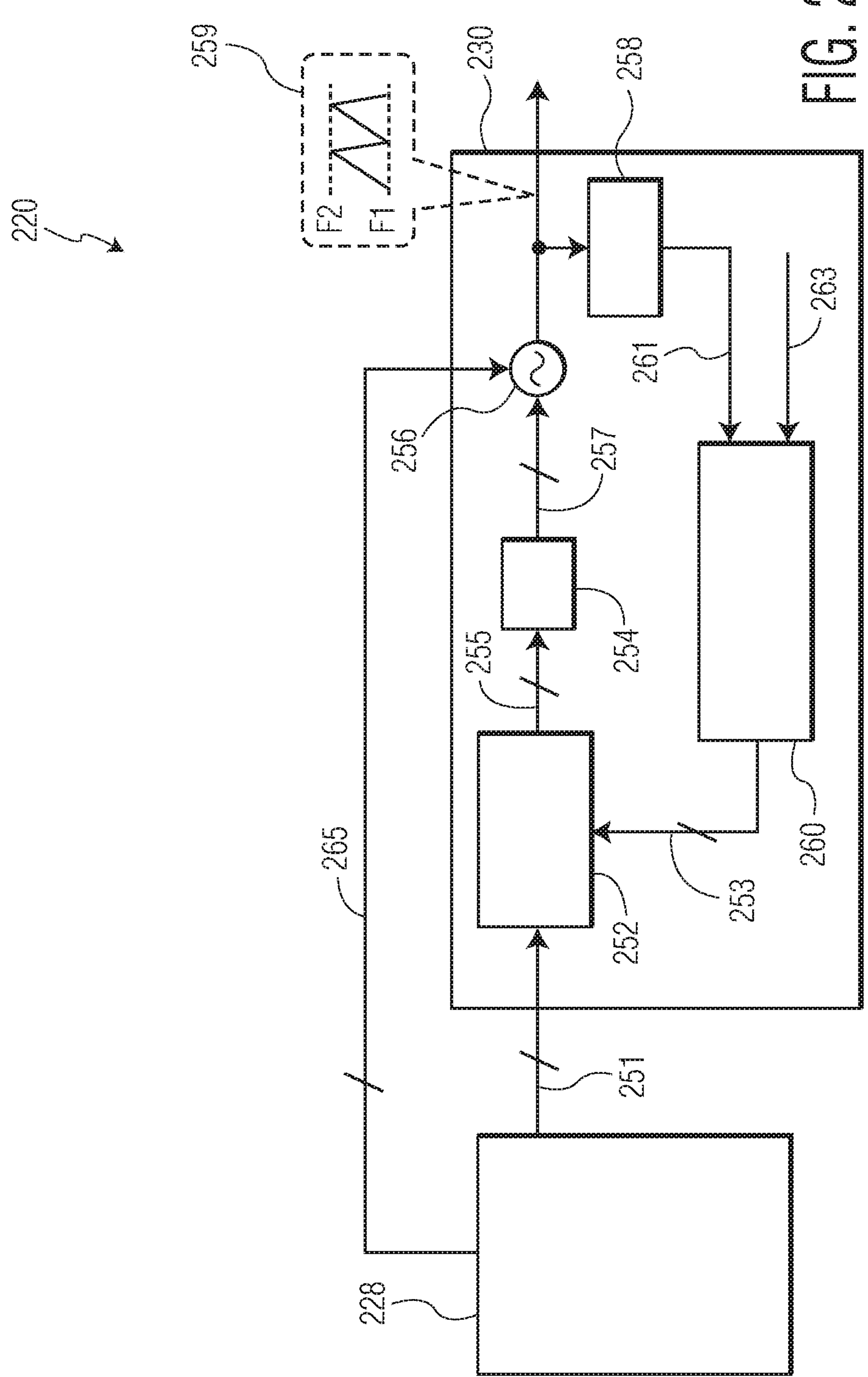

FIGS. 2A-2B illustrate further example apparatuses for frequency resolution control, in accordance with the present disclosure. More specifically, FIG. 2A illustrates an example apparatus 220 that includes digital PLL circuitry 230, control circuit 228, and front-end circuit, such as the illustrated receiver 222 and transmitter 223, as previously described in connection with FIG. 2A.

The apparatus 220 includes a radar transceiver having at least one receiver 222 and at least one transmitter 223 for transmitting the radar wave signal and receiving reflected radar signals. A reference PLL circuit 232 creates a reference clock (Fref clock) 233 of the radar transceiver, such as from a quartz resonator. The chirp PLL 230 includes digital PLL circuitry, such as the digital PLL circuitry 104 previously described in connection with FIG. 1, that generates the chirp sequence 221 for the radar system. The chirp or ramp has a slope and chirp BW that is set according to the programmed FCW 229 provided by the control circuit 228.

The control circuit 228 generates control signals (e.g., bank ctrl 231) for the radar operations. Example control signals include or are related to state machine, timing engine, clock and reset, calibration, chirp or ramp generation, etc. For example, the control circuit 228 generates the FCW 229 that creates the chirp sequence (F1, F2) 221 at the chirp PLL 230 output. The control circuit 228 additionally provides dynamic and static control signals for capacitor banks of the DCO circuit of the chirp PLL 230.

Other components of the apparatus 220 are described as follows. The output signal (LO) distribution chain circuit 234 distributes the PLL LO to the receiver 222 and transmitter 223. The power management (PM) unit 236 provides currents and voltages to all transceiver blocks. The memory circuit 224 stores different types of data (e.g., processed data if any, results of different calibrations) and contains register, Look-up Table (LUT), etc. The digital interfaces 226 (e.g., MIPI CSI2, ETH) provide digital data and its clock to external processing unit (DSP or central processor) using receiver output data 225. The serial parallel standard interface (SPI) 240 allows the radar transceiver to communicate with other devices in the radar module (MCU, slave devices, external memory, etc.). The sensors 238 include different sensors and monitors for functional safety purpose, e.g.. temperature sensors, supply monitor sensors, clock sensors, PLI, lock sensors, etc.

FIG. 2B illustrates further detail of an example implementation of the digital PLL circuitry 230 and the control circuit 228 as illustrated by FIG. 2A.

In the digital PLL circuitry 230, an N-hit digital FCW signal 251 is provided to a phase comparator 252 from the control circuit 228. The phase comparator 252 compares an N-bit digital feedback signal 253 to the FCW signal 251, and outputs an N-bit oscillator control signal 255 based on the comparison of the digital feedback signal 253 to the FCW signal 251. A digital low pass filter 254 filters the N-hit oscillator control signal 255, and outputs a filtered N-bit oscillator control signal 257 (e.g., mod_ctrl), which is provided to the DCO circuit 256. The DCO circuit 256 outputs a frequency signal 259 based on the filtered N-bit oscillator control signal 257. A feedback path of the digital PLL circuitry 230 includes a divider 258 that divides the output frequency signal 259 to generate a frequency-divided signal 261, which is provided to a time-to-digital converter (TDC) circuit 260, The TDC circuit 260 also receives a reference frequency signal 263, which is used to sample the frequency-divided signal 261. The TDC circuit 260 outputs the N-bit digital feedback signal 253 based on a measured time interval between the frequency-divided signal 261 and the reference frequency signal 263. As may be appreciated, the "N-bits" can be the same or different values from one another. For example, the N-bit digital feedback signal 253, an N-bit oscillator control signal 255, filtered N-bit oscillator control signal 257 can include different numbers of bits, in various embodiments.

Phase noise introduced by the digital PLL circuitry 230 is primarily due to the digital-to-analogue conversion performed by the DCO circuit 256, and time-to-digital conversion performed by the TDC circuit 260 in the feedback path, as previously described.

In accordance with various embodiments, the DCO circuit 256 outputs a frequency signal 259 based on the filtered N-bit oscillator control signal 257, herein represented by the signal Mod_ctrl (e.g., active during both PLL tracking and PLL modulation states). According to the chirp BW (e.g., BW=F2−F1) selected at application level, the frequency resolution of the DCO modulation bank of the DCO circuit 256 can be tuned (e.g., increased or decreased) before the modulation starts in order to cover the fill radar hand. DCO frequency resolution is set via a control signal, such as the bank control signal 265 of Fres_ctrl.

In response to or when tuning the DCO resolution, the center frequency of the DCO circuit 256 is impacted. In response or when the frequency resolution is programmed, and before modulation starts, an offset can be applied to re-center the DCO circuit 256. This is done through the compensation bank(s), and controlled by the bank control signal 265 of Comp_ctrl. In response to or when the DCO frequency resolution is selected, and the DCO circuit 256 re-centers, the digital PLL circuitry 230 can proceed with tracking and modulation states, and radar system can operate.

Figure 3:
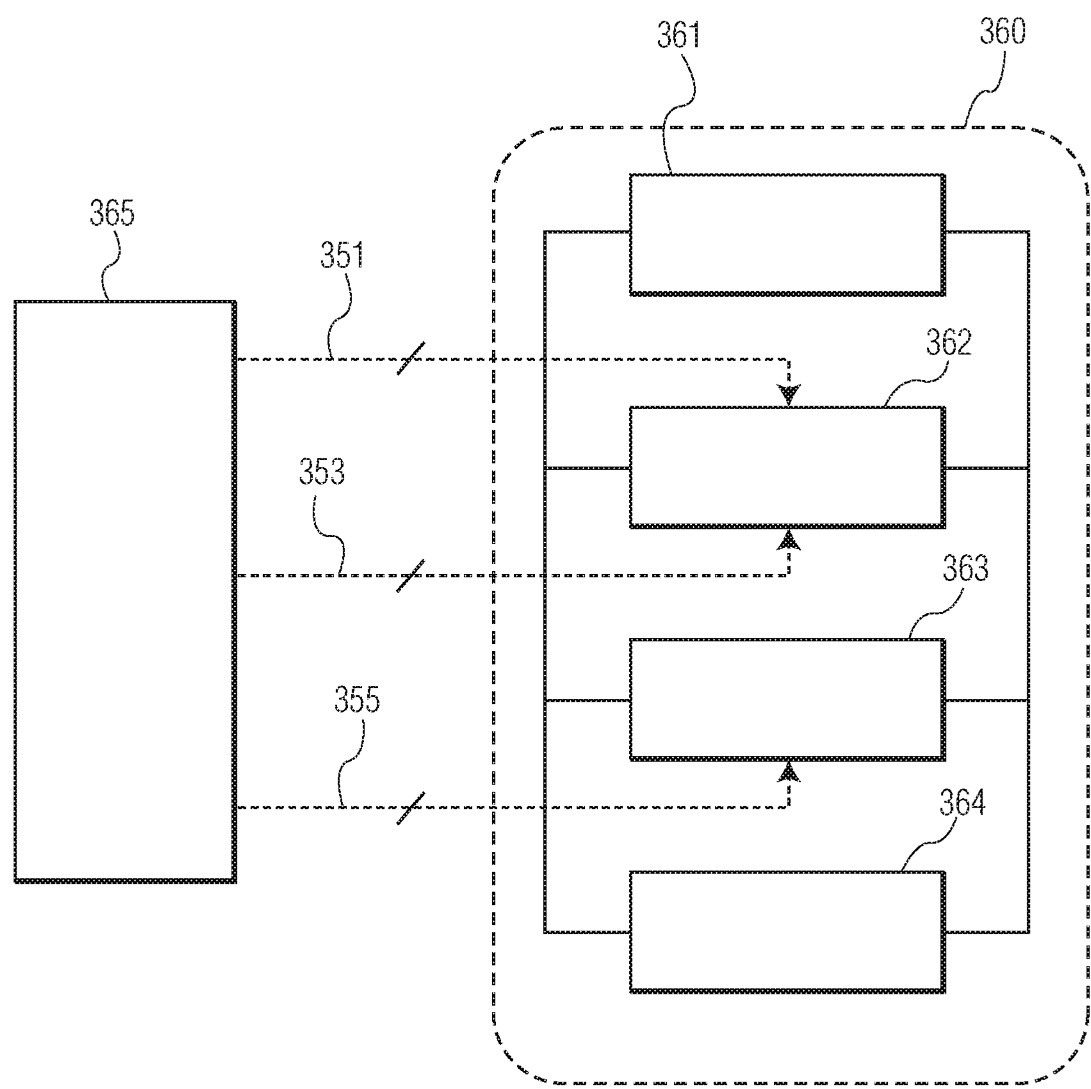
FIG. 3 illustrates a further example apparatus for frequency resolution control, in accordance with the present disclosure.

FIG. 3 illustrates a further example apparatus for frequency resolution control, in accordance with the present disclosure. The apparatus includes a control circuit 365 and a digital PLL having a DCO circuit. For ease of reference, only the DCO circuit 360 of the digital PLL circuitry is illustrated. As shown, the control circuit 365 provides various control signals (e.g., mod_ctrl (dynamic) 351, fres_ctrl (static) 353, and comp_ctrl (static) 355) to the DCO circuit 360 for controlling the frequency resolution.

The DCO circuit 360 includes a capacitive arrangement. The capacitive arrangement together with the oscillator circuit (e.g., the inductive element 364) of the DCO circuit 360 determines the DCO operating frequency (e.g., fosc=1/(2*pi*sqrt(LC)). For example, the oscillator is an inductive/capacitance (LC) based topology that uses the capacitive arrangement having one or more programmable capacitive banks. Each capacitive banks includes one or more capacitive elements, such as switched varactors.

As further described and illustrated herein, the DCO circuit 360 can be implemented using a LC based topology, with oscillating frequency given by fosc=1/(2*pi*sqrt(LC)). The capacitive arrangement can include a gain (Gm) stage 361 (negative resistance to allow oscillation), an inductor (L) as the inductive element 364, and several capacitive banks 362, 363. The modulation bank 362 is dynamically controlled by the PLL loop (Mod_ctrl 351), which is a digital word that controls switched capacitance elements inside the modulation bank(s) 362. This control is active during the tracking and modulation states of the PLL. This control can be forced by the control circuit 365 during an autonomous calibration (via a mux, as further illustrated herein). The modulation bank 362 can include a capacitive divider arrangement and circuitry with a programmable resolution feature (or programmable capacitance step).

More specifically, the Gm stage 361 can include a pair of transistors (e.g., p-type metal-oxide-semiconductor (PMOS), n-type metal-oxide-semiconductor (NMOS), bipolar) built using a negative feedback (−R) to reach the DC) oscillation condition, and which can be in variety of configurations (e.g., cross coupled, colpitts). The modulation bank(s) 362 can be one or more capacitive divider-based banks with programmable resolution. A capacitive divider bank can include different types of capacitive elements (e.g., capacitors, PMOS, NMOS, or bipolar based varactors, etc.). A dynamic bank can be controlled by modulation type (e.g., FMCW, binary phase shift keying). The compensation bank(s) 363 can include several compensation capacitor banks (static), such as static compensation (band selection, process re-centering, offset correction due to Modulation Bank resolution programmability) and can be made using any kind of capacitive element association. The inductive element 364 creates the resonant frequency with a capacitive load (LC tank) and can he built using ground referred, supply referred, center taped signal/differential inductor, 8-shape or another shaped inductance or transformer.

Figure 4:
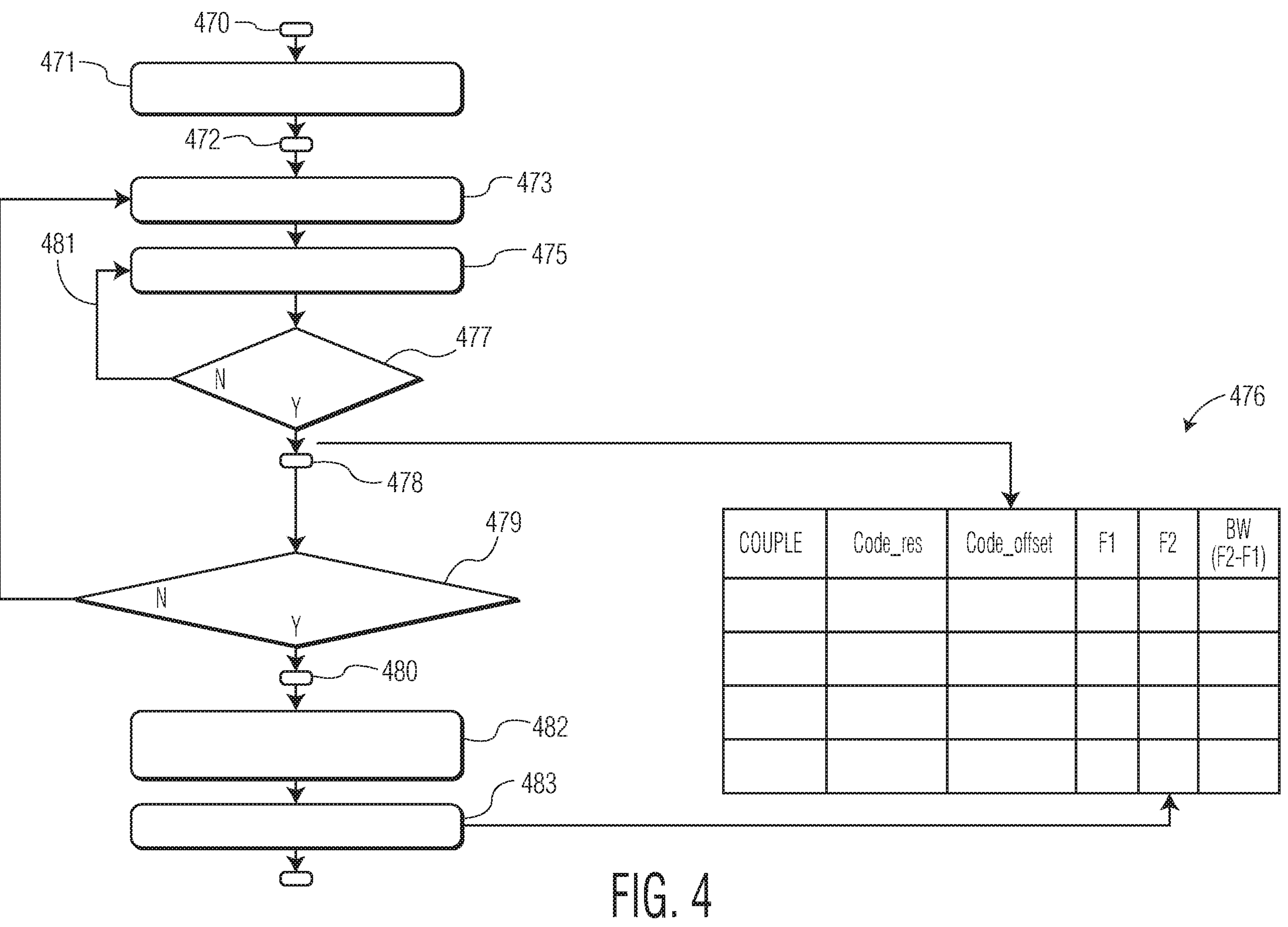
FIG. 4 is a flow chart illustrating an exemplary set of activities and/or data flow for configuring an apparatus of the type implemented in a manner consistent with FIG. 1, in accordance with the present disclosure.

FIG. 4 is a flow chart illustrating an exemplary set of activities and/or data flow for configuring an apparatus of the type implemented in a manner consistent with FIG. 1, in accordance with the present disclosure. In accordance with various embodiments, as described above, and further illustrated herein, changing the frequency resolution of the DCO circuit can include calibrating the DCO circuit using a control circuit. The calibration can include identifying control codes to select the frequency resolution for different chirp BWs and related offset. The offset can include or be representative of a compensation for a change in the off-state capacitance reduction when moving to the higher frequency step (e.g., associated with the SRR waves), and/or a frequency offset compensation when switching between chirp BWs. The calibration is illustrated for a single modulation bank, however embodiments can include the use of multiple modulation banks and different calibration techniques can be used.

In the particular example illustrated by FIG, 4, the process for calibration may be performed in an open loop. The control signals that control the modulation bank (e.g., mod_ctrl) can be forced by the control circuit via a mux that forces the particular control code (e.g., code_mod) at the digital filter output which correlates with the modulation bank input. The calibration, in response, can be performed without locking the digital PLL circuitry.

The calibration process starts, at 470, and in response, the DCO circuit is re-centered for PV (process voltage) variations, at 471. The re-centering of the DCO circuit can include finding code_PV which is a code where the oscillating frequency fosc=Fmid. In response, at 472, the default codes are loaded to the DCO circuit. Further, F1 is set. The default codes can include:

code_PV
code_res=code_max
code_mode=cod_modmax

For example, code_res=code_max can he set for higher resolution (e.g., lower capacitive step value), code_mode=cod_modmax can be set at the beginning of the chirp sequence. Code_res is the code setting the frequency resolution/step. Code_mod relates to the modulation bank, the capacitance step value, and which is dynamically updated. More specifically, code_mod is the code setting the oscillation frequency (e.g., F1, F2) according to the selected BW and selected level of capacitance (e.g., indicates to sequentially sweep from F1 to F2 and vice versa according to a given chirp or interchirp time, Tchirp or Tinterchirp).

After loading the default codes, at 473, and setting F1, the code_res is incremented. Incrementing code_res, as used herein, can include increasing or decreasing the frequency resolution. More specifically, incrementing can cause a change in the selected capacitance value steps for the selected capacitance level of the chirp BW. After incrementing, at 475, the oscillation frequency Fosc of the DCO circuit is measured by sequencing through a set of the incremented capacitance values steps for the selected chirp BW from the start frequency to the stop frequency. The resulting Fosc is compared to the start frequency F1, at 477. In response to a match, a code_offset is stored, at 478. The code_offset is a selected frequency offset compensation indicative of ΔF (e.g., change of F1 and F2). As described above, the offset can compensates for the change in the off-state capacitance reduction when moving to the higher resolution. In response to a mismatch, the frequency offset code is incremented, at 481, the Fosc is measured, at 475, and recompared to the start frequency, at 477. In response to a match, the code_offset is stored in a LUT 476, at 478. The respective code_res is then compared to a code_resmax to determine if the resolution code has reached the maximum resolution code that can be set, this maximum limit can be set during a design phase. If not, the process repeats the increment of the code_res, at 473, measures Fosc, at 475, compares to the start frequency, at 477, and compares to code_resmax, at 479. In response to a match, at 480, the code_mod is changed to code_modmin indicating the maximum achievable frequency (F2). At 482, the respective couple codes (codes_res and code_offs) are loaded and the Fosc is measured to store the stop frequency in the LUT 476, at 483, and in response, at 484, the LUT is ready (e.g., the calibration is complete). Below is an example LUT 476, however, embodiments are not so limited:

| Couple | Code_res | Code_offset | F1 | F2 | BW (F2-F1) |
|---|---|---|---|---|---|
| Couple1 | Code_res1 | Code_offs1 | F1 | F2 | BW1 |
| Couple2 | Code_res2 | Code_offs2 | F1 | F2' | BW2 |
| . . . | . . . | . . . | | | . . . |
| CoupleN | Code_resN | Code_offsN | F1 | F2" | BW_N |

Figure 5A:
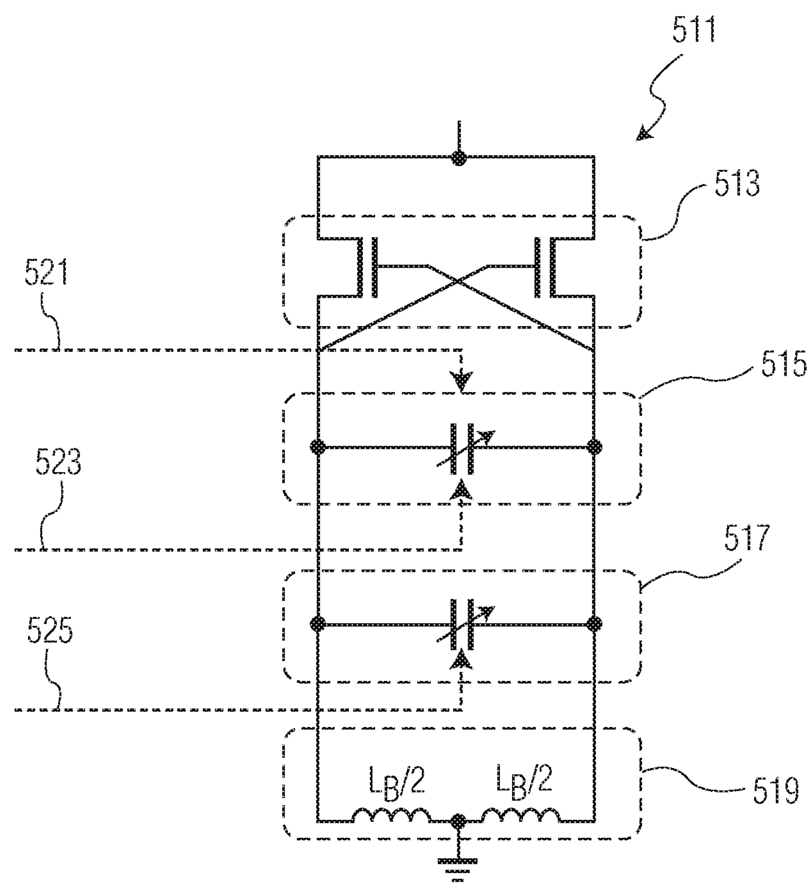
FIGS. 5A-5B illustrate an example capacitive arrangement of an apparatus, in accordance with the present disclosure.
Figure 5B:
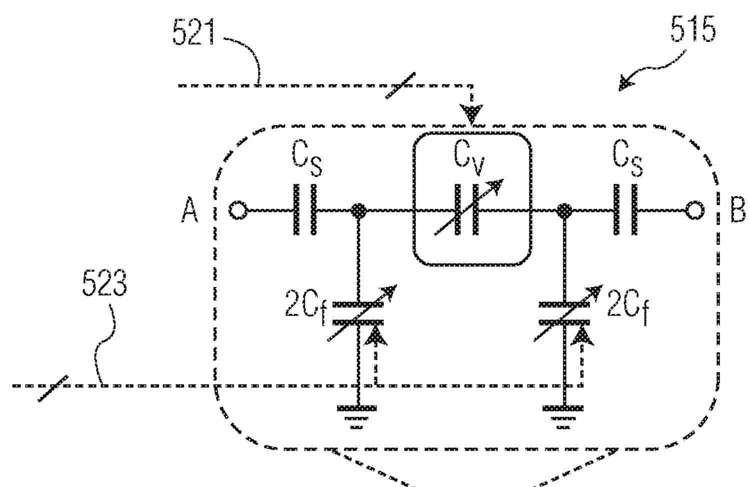

FIGS. 5A-5B illustrate an example capacitive arrangement of an apparatus, in accordance with the present disclosure. FIG. 5A, for example, illustrates an example capacitive arrangement 511 as is consistent with the previously illustrated arrangement of FIG. 3. The capacitive arrangement 511 similarly includes a Gm stage 513, a modulation bank 515, and PV bank 517, and an inductive element 519, and further illustrates the respective control signals that control the arrangement. FIG. 5B illustrates a specific example of a modulation bank 515 and the control signals (e.g., code_res 523 and code_mod 521, as well as code_PV 525) that are used by the control circuit to control the oscillation frequency and the frequency resolution of the DCO circuit. As may be appreciated, code_res 523 is sometime herein interchangeably referred to as Fres_prog and code_mod 521 is sometimes herein interchangeably referred to as mode_ctrl. The following illustrates example operating principles and the variation of the frequency resolution (Δf) when a capacitor is switched inside the capacitive divider (ΔCv):

$$C_{eq} = \frac{C_s(C_v + C_f)}{2(C_v + C_f) + C_s}, \tag{1}$$

-continued $$\Delta C_{eq} = \frac{C_s^2}{(2C_v + 2C_f + C_s)^2} \times \Delta C_v, \tag{2}$$

$$\omega_0 = \frac{1}{\sqrt{L_B C}}, \tag{3}$$

$$\frac{\partial \omega_0}{\partial C} = -\frac{\omega_0}{2C}, \tag{4}$$

$$\partial f_0 = \Delta f = \left| -\frac{f_0 \cdot \Delta C}{2C} \right|, \tag{5}$$

$$f_0 = \frac{1}{2\pi\sqrt{L_B C}} \tag{6}$$

From Eq. 6 into Eq. (5):

$$\Delta f = \frac{\Delta C}{4\pi C\sqrt{L_B C}}, \tag{7}$$

where ΔCv produces a constant ΔCeq capacitance step (Cf fixed), and varying Cf (ΔCv fixed) changes the capacitance step. This capactance step translates to a frequency step of, e.g., from Eq 2. into Eq. 7:

$$\Delta f = \frac{C_s^2 \times \Delta C_v}{4\pi C\sqrt{L_B C} \times (2C_v + 2C_f + C_s)^2}. \tag{8}$$

As shown above, changing Cf also changes Ceq, which can include or otherwise require a static correction of DCO free-running frequency. This shows that the resolution can be varied by varying the capacitance divider of FIG. 5B, e.g., the shunt banks 2Cf. For more information, reference is made to U.S. Pat. No. 9,379,721, entitled "Capacitive Arrangement for Frequency Synthesizer", filed Dec. 22, 2014, which is incorporated in its entirety for it general and specific teachings related to a DCO circuit and respective capacitive arrangement.

Figure 6A:
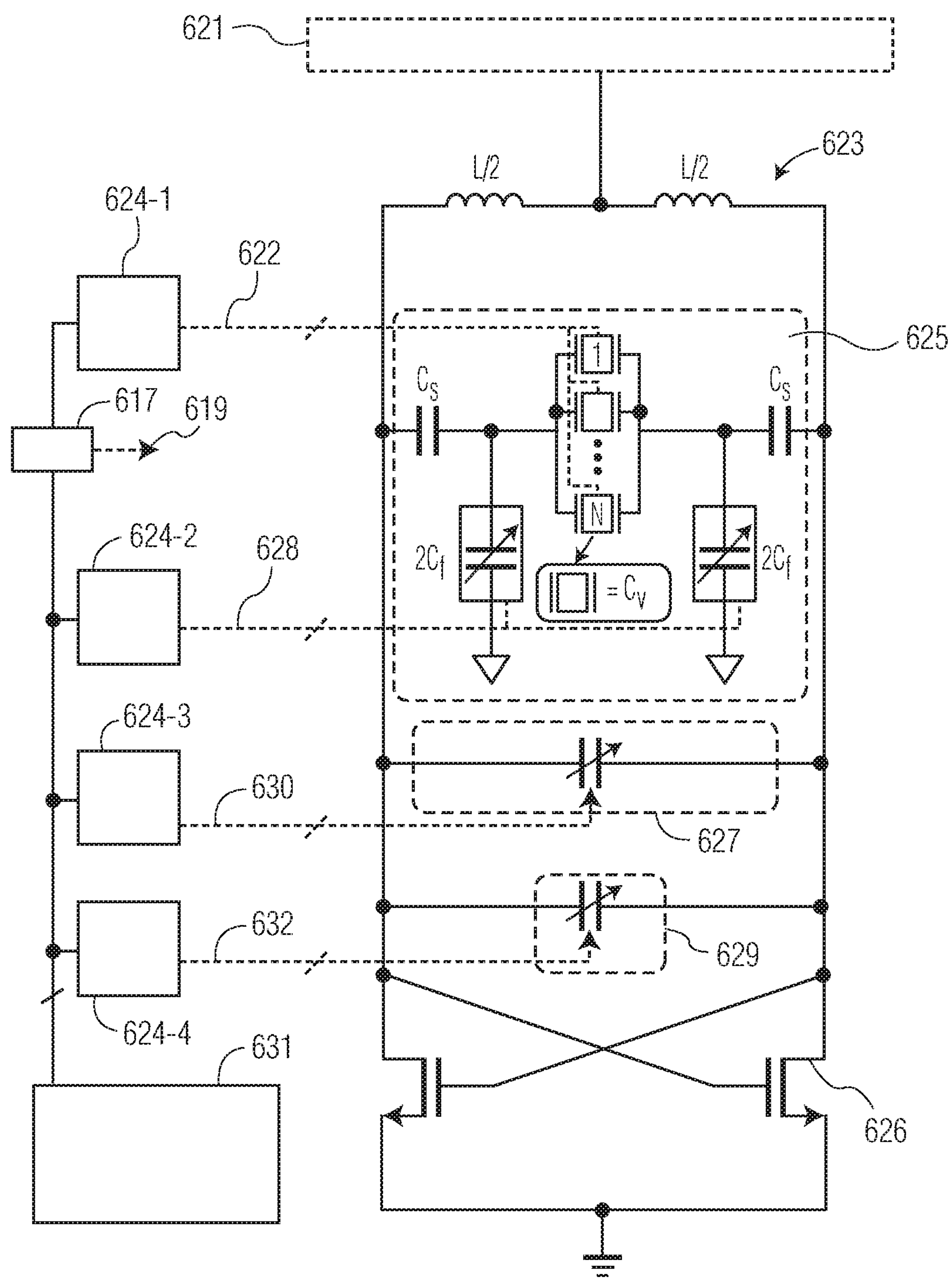
FIGS. 6A-6B illustrate a further example apparatus for frequency resolution control, in accordance with the present disclosure.
Figure 6B:
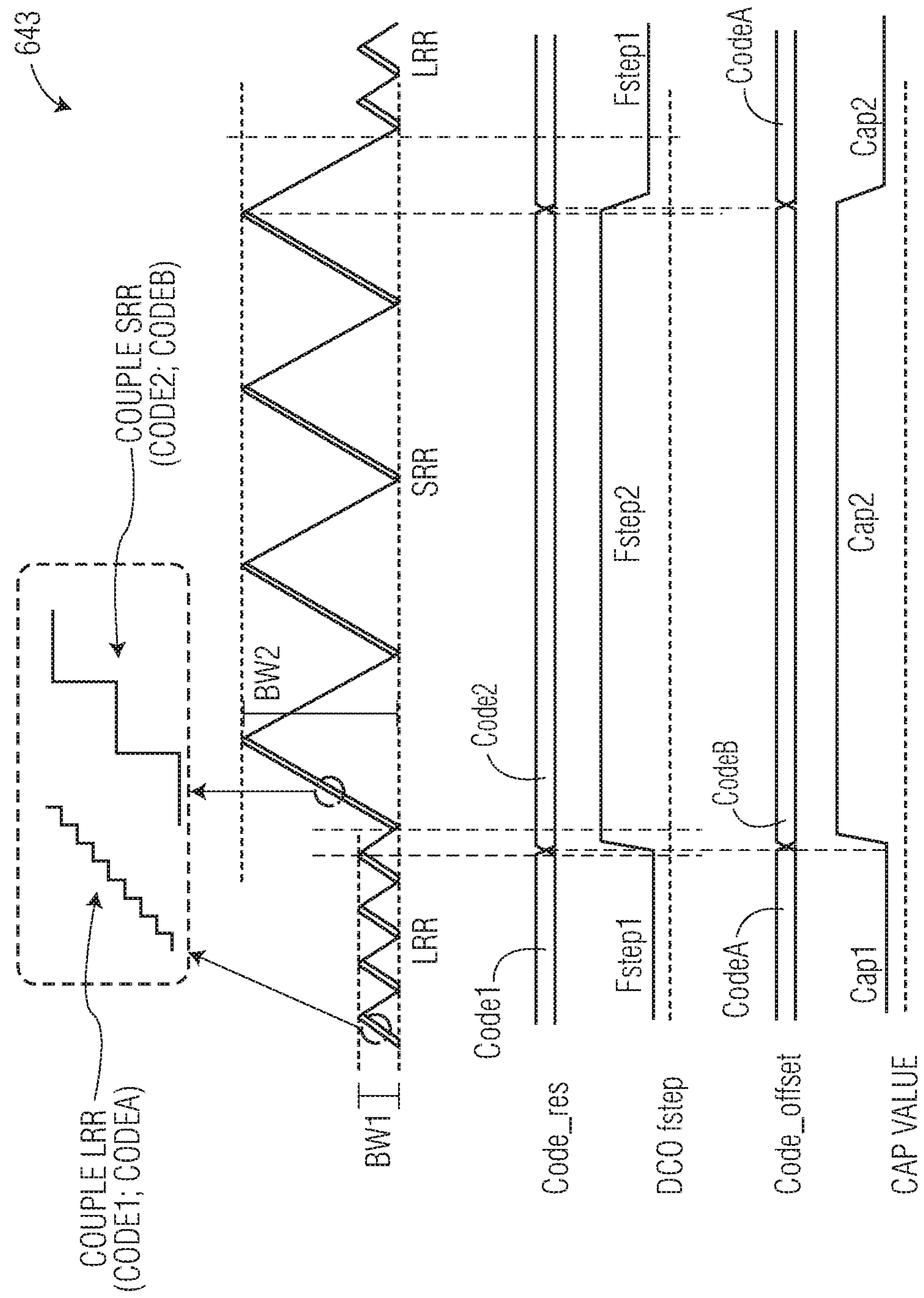

FIGS. 6A-6B illustrates a further example apparatus for frequency resolution control, in accordance with the present disclosure. As illustrated, the apparatus includes a DCO circuit having a capacitive arrangement and a control circuit 631, as well as the respective low noise supply/current source 621.

The capacitive arrangement has a single modulation bank 625 and two compensation banks 627, 629, as well as the previously described inductor 623 and Gm stage 626. The two compensation banks 627, 629 include an offset bank 627 and a PV bank 629. The inductor 623 has a center-tapped structure, the centered being coupled to a ground reference (GND).

The capacitive arrangement is controlled and/or programmed via the control circuit 631 and respective decoders, Dec1 624-1, Dec2 624-2, Dec3 624-3, and Dec4 624-4. The decoders couple respective input terminals of the capacitive banks, The decoders, for example, convert binary input to a thermometric set of control inputs to he coupled to capacitive elements (e.g.. switched varactors) of the banks. In this example, Dec1 624-1 is a binary to thermo decoder used to set the oscillation frequency (e.g., F1, F2) according to the input code, code_mod 622. Dec2 624-2 is a binary thereto decoder used to set the frequency resolution according to the input code, code_res 628. Dec3 624-3 is a binary thermo decoder used to set the offset compensation according to the input code, code_offs 630. Dec4 624-4 is a binary thermo decoder used to set the PV variation compensation and enabling frequency trimming to a selected chirp BW according to the input control, code_PV 632. The control signals that control the modulation bank (e.g., mod_ctrl) can be forced by the control circuit 631 via a mux 617 that forces the particular control code (e.g., code_mod 622) at the digital low pass filter 619 output which correlates with the modulation bank input.

FIG. 6B illustrates resulting chirp sequences and code signals for controlling the frequency resolution using the capacitive arrangement illustrated by FIG. 6A. The diagram 643 of the chirp sequences and code signals illustrates that there are no overlaps between modulation banks, as only one modulation bank 625 is used for all selected chirp BWs, and no calibration may be needed for the coarse bank to fine bank handover during modulation, since a single bank is used in such example embodiments. The BW1 and BW2, or another other BW in between, are covered by the single modulation bank 625 (FIG. 6A). The compensation offset due to Fres may be calibrated. As previously described, the offset compensates for a change in the off-state capacitance reduction when moving to the higher frequency step (lower resolution).

Figure 7A:
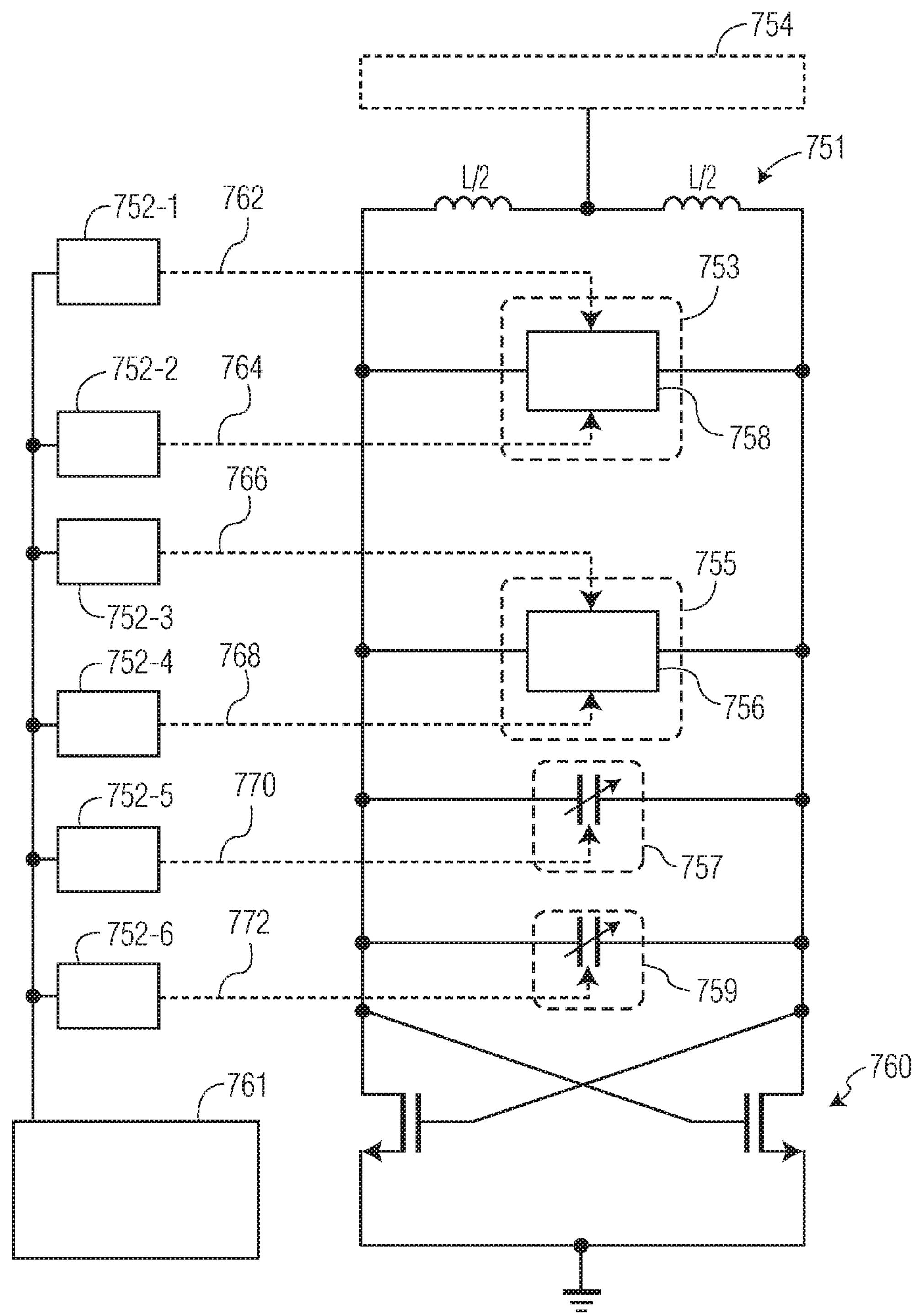
FIGS. 7A-7C illustrate a further example apparatus for frequency resolution control, in accordance with the present disclosure.
Figure 7B:
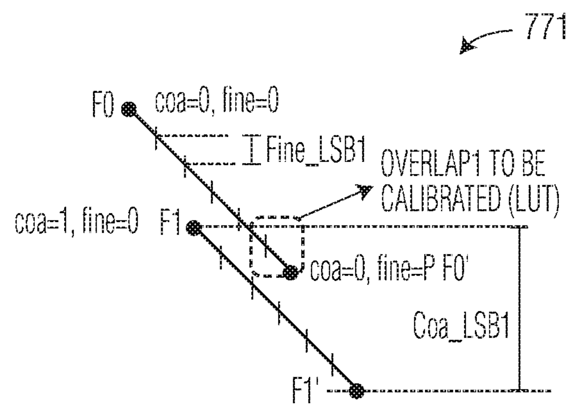

FIGS. 7A-7B illustrates a further example apparatus for frequency resolution control, in accordance with the present disclosure. As illustrated, the apparatus includes a DCO circuit having a capacitive arrangement and control circuit 761, as well as the low noise supply/current source 754.

The capacitive arrangement has two modulation banks 753, 755 and two compensation banks 757, 759, as well as the previously described inductor 751 and Gm stage 760. The two modulation banks 753, 755 include a first modulation bank 753 (e.g., having capacitive divider bank (F) 758) for providing fine frequency steps during modulation, and a second modulation bank 755 (e.g., having capacitive divider bank (C) 756) for providing coarse frequency steps during modulation. The two compensation banks 757, 759 include an offset bank 757 and a PV bank 759, similar to that previously described in connection with FIG. 6A. The inductor 751 has a center-tapped structure, the centered being coupled to GND.

The capacitive arrangement is controlled and/or programmed via the control circuit 761 and respective decoders, Dec1 752-1, Dec2 752-2, Dec3 752-3, Dec4 752-4, Dec5 752-5, and Dec6 752-6. The decoders couple respective input terminals of the capacitive banks, as previously described. In this example, Dec1 752-1 is a binary to thermo decoder used to set the oscillation frequency (e.g., F1, F2) according to the input code, code_mod_F 762, for the fine bank. Dec2 752-2 is a binary thermo decoder used to set the frequency resolution according to the input code, code_res_F 764, for the fine bank. Dec3 752-3 is a binary to thermo decoder used to set the oscillation frequency (e.g., F1, F2) according to the input code, code_mod_C 766, for the coarse bank. Dec4 752-4 is a binary thermo decoder used to set the frequency resolution according to the input code, code_res_C 768, for the coarse bank. Dec5 752-5 is a binary thermo decoder used to set the offset compensation according to the input code, code_offs 770. Dec6 752-6 is a binary thermo decoder used to set the PV compensation and enabling frequency trimming to a selected chirp BW according to the input control, code_PV 772. Both coarse and fine banks resolutions can be tuned according to the chirp BW selected, and the offset compensation bank 757 is calibrated accordingly to compensate for the change in the off-state capacitance reduction when moving to higher frequency steps.

Figure 7C:
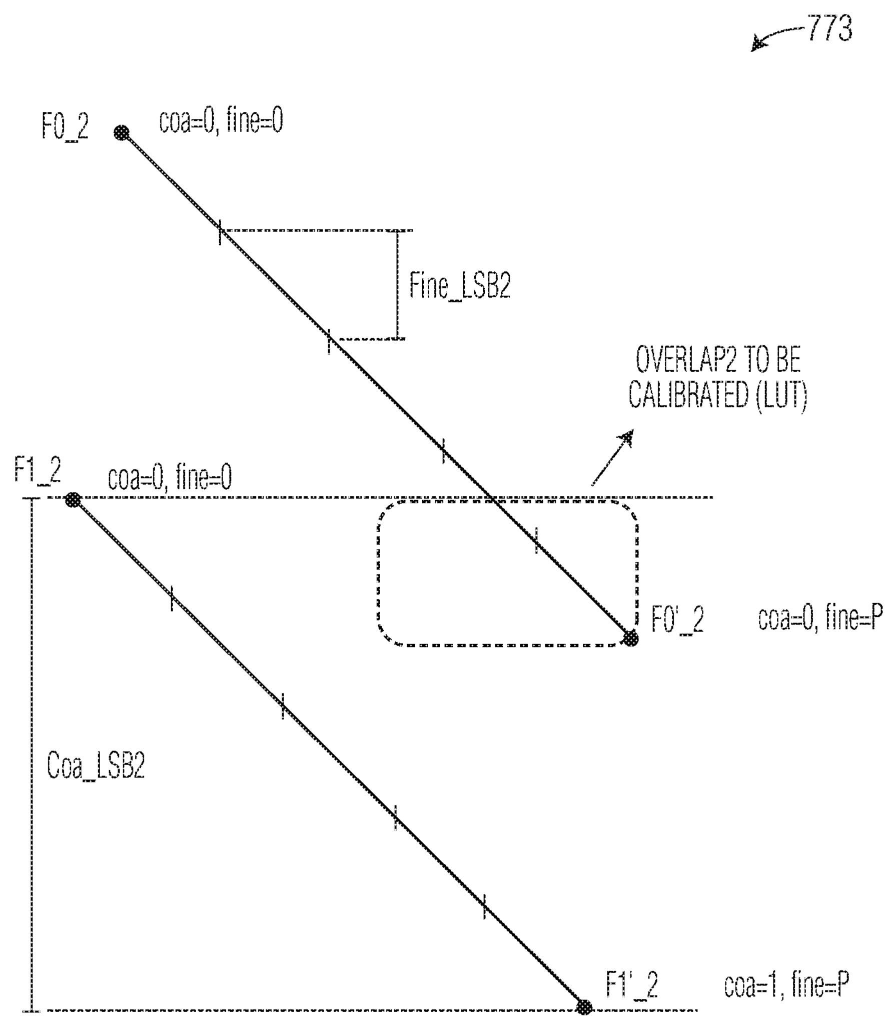

FIGS. 7B-7C illustrate resulting chirp sequences and code signals for controlling the frequency resolution using the capacitive arrangement illustrated by FIG. 7A. As shown by the diagrams 771 and 773 illustrating chirp sequences and code signals for controlling the frequency resolution in accordance with an apparatus illustrated by FIG. 7A, there are overlaps between modulation banks, as two modulation banks 753, 755 are used for all selected chirp BWs. Accordingly, a bank-to-bank handover calibration (overlap or offset) for each resolution is calibrated, e.g., codes to be stored in LUT. The BW1 and BW2 or another any other in between, are covered by the two modulation banks 753, 755 illustrated by FIG. 7A. The offset can include the resolution programmable in the coarse and fine banks, such as identifying comp2 which is indicative of when F0_2=F0. This offset can include a frequency offset compensation when switching between chirp BWs of BW1 and BW2.

Embodiments in accordance with the present disclosure are directed to radar apparatuses having programmable DCO frequency resolution which is changed according to the selected chirp BW. In various applications, both LRR and SRR waves are transmitted and received by the radar apparatus. LRR applications can have stringent requirements in terms of transmitted radar phase noise (PN_tx), which usually use short chirps with limited modulation BW (e.g., less than 1 GHz). SRR applications may require higher chirp modulation BW (e.g., up to 5 GHz) and can tolerate some phase noise (PN) degradation without compromising system performance, such as target detection and target separation. Apparatuses in various embodiments include a single DCO circuit to cover both SRR and LRR applications. The DCO usually dominates transmitted output-of-band noise (e.g., less than 1 MHz frequency offset). For LRR applications, such as with chirp BW of less than 1 GHz, the DCO circuit must present a low frequency step (higher resolution) to keep its quantization noise (QN) lower than its intrinsic noise (PN_dco), and making total DCO phase noise (PN_tot) close to its intrinsic noise. The same DCO circuit can present a higher frequency step (lower resolution) for SRR applications, such as with chirp BW of up to 5 GHz, using a programmable capacitor bank. The DCO circuit includes a capacitive arrangement having the programmable capacitor bank used to select a resolution coupled to or linked to the selected chirp BW. The DCO frequency resolution is relaxed (e.g., larger frequency steps) for higher chirp BWs (e.g., SRR applications) using the same capacitor bank. The DCO circuit can present an acceptable quantization noise (QN) for SRR, as the digital PLL in-band noise, which impacts the SRR application, is limited by the TDC and not the DCO.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful far implementing the claimed disclosure by way of various circuits or circuitry which may be illustrated as or using terms such as blocks, modules, device, system, unit, controller, and/or other circuit-type depictions (e.g., reference numerals 106 and 228 of FIGS. 1-2A depict a block/module as described herein). Such circuits or circuitry are used together with other elements to exemplify how certain embodiments may he carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 2B and 5B. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described at 4 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the DCO circuit illustrate by FIG. 6A or FIG. 7A can be implemented in the apparatus illustrated by FIGS. 1 and 2A. As another example, the apparatus illustrated by FIGS. 1 and 2A can be used to implement the process illustrated by FIG. 4. Such modifications do not depart from the true spirit and scope of various aspects of the disclosure, including aspects set forth in the claims.

What is claimed is:

1. An apparatus for use with front-end circuitry to transmit and receive radar wave signals, the apparatus comprising:

digital phase locked loop, PLL, circuitry configured and arranged to provide a chirp sequence with frequency modulated continuous wave, FMCW, signals, the FMCW signals being chirps containing a start frequency, F1, and a stop frequency, F2, representing a selected chirp bandwidth, BW, of F2-F1, the digital PLL circuitry including a digitally controlled oscillator, DCO, circuit which frequency resolution is configured and arranged to be tuned relative to the selected chirp BW, the frequency resolution configured in response to a selected level of capacitance; and a control circuit configured and arranged to control the selected level of capacitance used by the DCO circuit by changing the frequency resolution of the DCO according to the selected chirp BW, wherein different frequency resolutions are used for a first selected chirp BW and for a second selected chirp BW.

2. The apparatus of claim 1, wherein the control circuit is configured and arranged to change the frequency resolution of the DCO circuit by causing the selected capacitance level to sequence through different capacitance value steps for the first selected chirp BW than for the second selected chirp BW, wherein a maximum difference between capacitance value steps for the first selected chirp BW is less than a minimum difference between capacitance value steps for the second selected chirp BW.

3. The apparatus of claim 1, wherein the digital PLL circuitry is arranged as a chirp generator and configured to provide the chirp sequence with the FMCW signals, the first selected chirp BW being associated with first range radar waves and the second selected chirp BW being associated with second range radar waves, the second radar range being shorter than the first radar range.

4. The apparatus of claim 1, wherein the DCO circuit includes a capacitance bank configured and arranged to provide the selected capacitance level according to the frequency resolution and with a selected frequency offset compensation.

5. The apparatus of claim 1, wherein the control circuit is configured and arranged to change the frequency resolution of the DCO by causing the selected capacitance level to sequence through a first set of capacitance value steps for the first selected chirp BW and to sequence through a second set of capacitance value steps for the second selected chirp BW, the first set of capacitance value steps being different from the second set of capacitance value steps.

6. The apparatus of claim 5, wherein the capacitance value steps of the first set are equally spaced.

7. The apparatus of claim 5, wherein the capacitance value steps of the second set are equally spaced.

8. The apparatus of claim 1, wherein the control circuit is configured and arranged to control the selected level of capacitance used by the DCO circuit includes changing the frequency resolution of the DCO circuit according to the selected chirp BW for optimizing a tuning range of the front-end circuitry, the front-end circuitry being a FMCW radar transceiver.

9. The apparatus of claim 8, further including the FMCW radar transceiver to transmit and receive the radar wave signals corresponding to long range radar (LRR) waves and short range radar (SRR) waves in response thereto.

10. The apparatus of claim 9, wherein a maximum difference between capacitance value steps of the LRR waves is less than a minimum difference between capacitance value steps of the SRR waves.

11. The apparatus of claim 1, wherein the DCO circuit includes a first capacitance bank and a second capacitance bank configured to provide the selected capacitance level, the first and second capacitance banks being configured to sequence through a first set of capacitance value steps for the first selected chirp BW and to sequence through a second set of capacitance value steps for the second selected chirp BW.

12. The apparatus of claim 11, wherein the control circuit is configured to control the first capacitance bank and the second capacitance bank to simultaneously provide a maximum level of the first set of capacitance value steps and a next level in a sequence of the second set of capacitance value steps.

13. The apparatus of claim 1, wherein the DCO includes a capacitive arrangement having a plurality of programmable capacitive circuits that determine the frequency of an output frequency signal of the DCO circuit and which provide the selected level of capacitance, the selected level of capacitance representing a given capacitance value and a given capacitance step.

14. A method comprising:

receiving radar wave signals corresponding to first range radar waves and second range radar waves, the second range radar waves being associated with a shorter range than the first range radar waves;

providing, by digital phase locked loop, PLL, circuitry configured and arranged as a chirp generator, a chirp sequence with frequency modulated continuous wave, FMCW, signals, the FMCW signals being a chirp containing a start frequency, F1, and a stop frequency, F2, representing a selected chirp bandwidth, BW, the digital PLL circuitry including a digitally controlled oscillator, DCO, circuit which frequency resolution is configured and arranged to be tuned relative to the selected chirp BW, the frequency resolution configured in response to a selected level of capacitance; and controlling the DCO circuit of the digital PLL circuitry by selecting the level of capacitance used by the DCO circuit and by causing the selected capacitance level to sequence through a first set of capacitance value steps for the selected chirp BW associated with the first range radar waves and to sequence through a second set of capacitance value steps for the selected chirp BW associated with second range radar waves, the first set of capacitance value steps being different from the second set of capacitance value steps.

15. The method of claim 14, wherein a maximum difference between capacitance value steps of the first set for the first range radar waves is less than a minimum difference between capacitance value steps of the second set for the second range radar waves.

* * * * *